(12) United States Patent
Loebl et al.

(10) Patent No.: US 8,963,143 B2
(45) Date of Patent: Feb. 24, 2015

(54) ORGANIC ELECTROLUMINESCENT DEVICE

(75) Inventors: Hans-Peter Loebl, Monschau-Imgenbroich (DE); Herbert Friedrich Boerner, Aachen (DE); Claudia Michaela Goldmann, Kreuzau (DE)

(73) Assignee: Koninklijkle Philips N.V., Eindhoven (NL)

( * ) Notice: Subject to any disclaimer, the term of this patent is extended or adjusted under 35 U.S.C. 154(b) by 93 days.

(21) Appl. No.: 13/883,797

(22) PCT Filed: Nov. 3, 2011

(86) PCT No.: PCT/IB2011/054894
§ 371 (c)(1),
(2), (4) Date: Jun. 28, 2013

(87) PCT Pub. No.: WO2012/063171
PCT Pub. Date: May 18, 2012

(65) Prior Publication Data
US 2013/0285027 A1     Oct. 31, 2013

(30) Foreign Application Priority Data

Nov. 9, 2010    (EP) ..................................... 10190478

(51) Int. Cl.
| | |
|---|---|
| *H01L 35/24* | (2006.01) |
| *H01L 51/52* | (2006.01) |
| *H01L 51/50* | (2006.01) |
| *H01L 51/56* | (2006.01) |
| *H01L 51/00* | (2006.01) |

(52) U.S. Cl.
CPC ........ *H01L 51/5203* (2013.01); *H01L 51/5076* (2013.01); *H01L 51/508* (2013.01); *H01L 51/5084* (2013.01); *H01L 51/56* (2013.01); *H01L 51/0067* (2013.01)
USPC 257/40; 257/103; 257/E51.002; 257/E51.018

(58) Field of Classification Search
USPC ................... 257/40, 103, E51.001, E51.002, 257/E51.018
See application file for complete search history.

(56) References Cited

U.S. PATENT DOCUMENTS

| | | | |
|---|---|---|---|
| 7,736,754 B2 * | 6/2010 | Kijima et al. ................. | 428/690 |
| 7,750,561 B2 * | 7/2010 | Aziz et al. ..................... | 313/506 |
| 8,350,257 B2 * | 1/2013 | Pieh et al. ........................ | 257/40 |
| 2006/0127697 A1 | 6/2006 | Lee et al. | |
| 2007/0114919 A1 | 5/2007 | Sotoyama | |
| 2010/0052525 A1 | 3/2010 | Oda et al. | |
| 2010/0253209 A1 | 10/2010 | Spindler | |
| 2012/0025180 A1 * | 2/2012 | Matsumoto ..................... | 257/40 |
| 2013/0056717 A1 * | 3/2013 | Ishihara et al. ................. | 257/40 |

* cited by examiner

*Primary Examiner* — Matthew E Warren
(74) *Attorney, Agent, or Firm* — Meenakshy Chakravorty

(57) ABSTRACT

The invention provides an OLED device with improved light out-coupling comprising an electroluminescent layer stack (2) on top of a substrate (1), where the electroluminescent layer stack (2) comprises an organic light-emitting layer stack (6) with one or more organic layers sandwiched between a first electrode (3) facing towards the substrate (1) and a second electrode (7) to apply a driving voltage to the organic light-emitting layer stack (6), and a first electron transport layer stack (4a) arranged between the organic light emitting layers stack (6) and the second electrode (7), wherein the electron transport layer stack (4a) comprises an electron transport layer (41) made of a first electron transport material having a low refractive index and at least one n-doped layer (40, 42). The invention further relates to a method to manufacture these OLED devices.

15 Claims, 6 Drawing Sheets

ORGANIC ELECTROLUMINESCENT DEVICE

FIELD OF THE INVENTION

The invention relates to the field of organic electroluminescent devices with improved light out-coupling.

BACKGROUND OF THE INVENTION

Organic electroluminescent diodes are devices (OLEDs), where organic molecules emit light when a driving voltage is applied to such organic electroluminescent devices. The OLEDs typically comprise a transparent substrate with an electroluminescent layer stack deposited on top of the substrate comprising an organic light emitting layer stack arranged between two electrode layers, typically a transparent anode made of Indium Tin Oxide (ITO) on top of the substrate and a reflective cathode made of aluminum on top of the organic layer stack. Since the organic molecules are sensitive to moisture and oxygen, the layer stack is encapsulated by a gastight cover lid sealed on top of the substrate. In order to operate the OLED, driving voltages in the order of a few volts, e.g. 2-15 V are applied. Due to the optical properties of the organic layers and the transparent substrate and resulting total reflection at the surfaces between organic layers and substrate as well as between substrate and air, only 20% of the light generated within the organic layer is coupled out of the organic electroluminescent device. The majority of the generated light is trapped within the glass substrate and the organic layers. It would be desirable to obtain an organic electroluminescent device, where the light out-coupling can be improved.

SUMMARY OF THE INVENTION

It is an object of the invention to provide an OLED device with improved light out-coupling properties.

This object is achieved by an organic electroluminescent device comprising an electroluminescent layer stack on top of a substrate, where the electroluminescent layer stack comprises an organic light-emitting layer stack with one or more organic layers sandwiched between a first electrode facing towards the substrate and a second electrode to apply a driving voltage to the organic light-emitting layer stack, and a first electron transport layer stack arranged between the organic light emitting layers stack and the second electrode, wherein the electron transport layer stack comprises an electron transport layer made of a first electron transport material having a low refractive index and at least one n-doped layer. Refractive indices are denoted as low in accordance to the present invention, if these refractive indices are close to the refractive indices of the transparent material, through which the light is coupled out of the OLED device. In case of so-called bottom emitters the substrate is made of a transparent material, e.g. glass having a refractive index of about 1.5. Typically low refractive indices have values of about 1.5. The n-doped layer might be arranged between the electron transport layer and the organic light emitting layer stack or between the electron transport layer and the second electrode. In other embodiments there are more than one n-doped layer arranged within the electron transport layer stack. The material of the n-doped layer might be commercially available n-doped materials, e.g. n-doped material from NOVALED. The present electron transport layer stack is suitable to improve the overall light out-coupling of the OLED device. As an example, a layer with a low refractive index arranged close to the second electrode, typically the cathode, will strongly reduce the amount of light being reflected back from the interface between electroluminescent layer stack and transparent substrate in case of a bottom emitting OLEDs and subsequently will improve the amount of light being coupled out of the OLED device. The amount of light trapped within the substrate might be increased compared to OLED devices not comprising the first electron transport material. However the light trapped within the transparent substrate can be coupled out to the environment by applying known out-coupling structures to the transparent substrate to further improve the light out-coupling. Since OLED devices could be used for room illumination, the values of the refractive indices given or discussed within the present invention refer to wavelengths within the visual spectrum.

The organic electroluminescent device may utilize organic small molecules or polymers to produce light within the organic light-emitting layer stack. Accordingly, OLEDs may be referred to as small molecule organic light emitting devices (SMOLEDs) or polymer light emitting devices (PLEDs). However, SMOLEDS are preferred because of their better light emission performance. OLEDs emitting the light through the substrate are denoted as bottom-emitter. The substrate of bottom emitters is made of a transparent material, e.g. glass or plastic, having two essentially parallel surfaces. OLEDs emitting the light through the side of the OLED opposite to the substrate are denotes as top-emitter. The electroluminescent layer stack comprises at least two electrodes as anode and cathode and an organic light emitting layer stack in between. Typically the first electrode is the anode and the second electrode is the cathode. The organic light-emitting layer stack may consist of a single light-emitting layer or may comprise a plurality of organic layers such as hole transporting layer, electron transporting layer, hole blocking layers, electron blocking layers, one or more light emitting layers, e.g. comprising a host material with embedded light emitting molecules. A large number of different electroluminescent layer stacks comprising a different number/type of layers is known to skilled people, which are able to chose a suitable electroluminescent layer stack in dependence on the desired application. In case of bottom-emitters, the electrode deposited on top of the substrate is a transparent anode as the first electrode, e.g. made of indium-tin-oxide (ITO). The second electrode might be aluminum. The OLED device according to the present invention might be a bottom-emitter or a top-emitter.

The electroluminescent layer stack might be covered by a cover lid in order to prevent moisture or oxygen penetrating into the organic light-emitting layer stack to provide OLEDs with a sufficient life-time. The cover lid is made of any suitable rigid material providing a sufficient barrier against diffusion of moisture and/or oxygen into the encapsulated volume between cover lid and substrate. The cover lid is sealed on top of the substrate by applying a suitable sealing material being sufficiently gas tight, at least against moisture and oxygen, e.g. glass frit (non conductive material) or conductive sealing material (e.g. epoxy glue with conductive filler). The term "sealed on top of the substrate" denotes a tight connection between cover lid and substrate. In case of substrates with additional layers (e.g. contact pads for first and/or second electrodes) on top, the cover lid is sealed to the substrate across theses layers. The cover lid has an inner and outer side, where the inner side denotes the side of the cover lid facing towards the electroluminescent layer stack(s). The outer side is correspondingly the other side of the cover lid. The shape of the cover lid is adapted to provide a gap between the inner side of the cover lid and the electroluminescent layer stacks. In other cases the gap might be filled with an inert fluid. The gap shall prevent any mechanical impact to the cover lid from the outside of the OLED device reaching the electroluminescent layers. A getter material might be arranged inside the gap, typically attached to the inner side of the cover lid. The gap between cover lid and electroluminescent layer stack could have dimensions up to a few millimeters. Typically the gap is filled with gas, e.g. dry nitrogen. Alternatively the gap might be filled with dry ambient air. In case of top emitting OLEDs the cover lid has to be transparent, e.g. a cover lid made of glass.

In an embodiment the first electron transport material has a refractive index n between 1.3 and 1.65, preferably a refractive index n between 1.4 and 1.57. The refractive indices for wavelengths within the visual spectrum of the neighboring layers are typically: 1.46-1.56 (borosilicate or crown glasses as the substrate), 1.8-2.0 (ITO as the first electrode) and 1.8-1.9 for the organic layers. The first electron transport material should have a refractive index n close to the refractive index of the substrate, preferably the same value for n as the substrate. In comparison to these refractive indices the refractive index of the low-n electron transport layer is lower than the refractive indices of the other organic layers leads to an improved light out-coupling and therefore to an OLED device with improved brightness at certain driving voltage compared to OLED devices without such Low-n electron transport layer. It is further advantageous to replace electron transport materials present in other layers of the electroluminescent layer stacks, for instance electron transporting layers (ETL-layers) within the organic light emitting layer stack, by electron transport materials having a low refractive index, because this would lower the average refractive index of all the organic layers and subsequently at least a part of the light otherwise being wave guided in the first electrode/organic light-emitting layer stack is able to penetrate into the glass substrate.

In an embodiment the first electron transport material is an organic compound comprising Fluor atoms. The present Fluor atoms reduce the refractive index compared to corresponding molecules not comprising Fluor atoms. Electron transport (or conducting) materials containing Fluor atoms have a low refractive index. It is therefore advantageous to use fluorinated electron transporting materials instead of common electron transporting (or conducting) materials. Fluorinated electron transport materials typically have refractive indices varying within the range of 1.3 and 1.65. Preferably the first electron transport material is fully fluorinated. In an preferred embodiment the first electron transport material is 2,4,6-tris-(nonafluorobiphenyl)-1,3,5-triazine with the following chemical formula having a refractive index ranging between 1.53 and 1.57 depending on the particular wavelength:

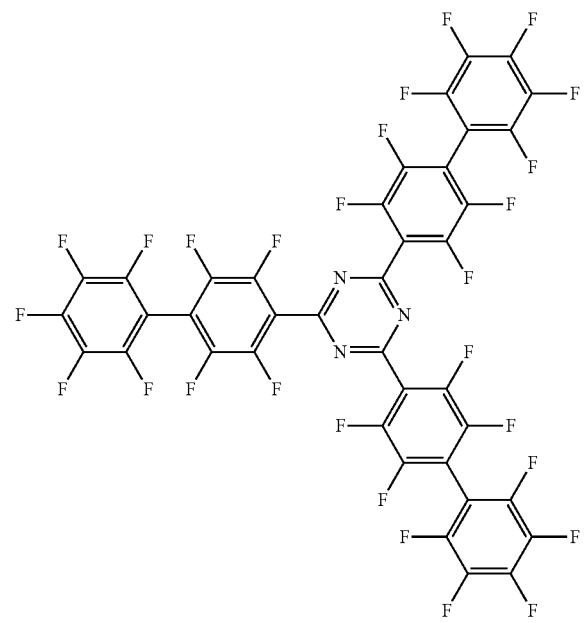 [SMILES: Fc1c(F)c(F)c(-c2c(F)c(F)c(-c3nc(-c4c(F)c(F)c(-c5c(F)c(F)c(F)c(F)c5F)c(F)c4F)nc(-c4c(F)c(F)c(-c5c(F)c(F)c(F)c(F)c5F)c(F)c4F)n3)c(F)c2F)c(F)c1F]

Chemical Formula 1:
2,4,6-tris-(nonafluorobiphenyl)-1,3,5-triazine

Furthermore 2,4,6-tris-(nonafluorobiphenyl)-1,3,5-triazine is a stable compound providing good life time properties for OLED devices.

In an embodiment the first electron transport layer stack further comprises two n-doped layers, where the electron transport layer is arranged in between the two n-doped layers to improve the light out-coupling properties of the electron transport layer stack.

In another embodiment the organic electroluminescent device further comprises a first charge generation layer stack arranged between the first electrode and the organic light-emitting layer stack, wherein the first charge generation layer stack comprise at least a n-doped layer facing towards the first electrode and a p-doped layer facing towards the organic light-emitting layer stack and at least a second electron transport layer stack arranged between the first charge generation layer stack and the first electrode comprising at least another electron transport layer made of the first electron transport material. The materials of the n-doped and p-doped layers of the first charge generation layer stack might be commercially available materials, e.g. n- and p-doped materials from NOVALED. The n-doped layer of the charge generation layer facing towards the electron transport material simultaneously act as the n-doped layer as part of the second electron transport layer stack. Therefore the second electron transport layer stack can be considered as a layer stack comprising also at least one n-doped layer as already specified for the first electron transport layer.

Commonly electron transporting layers (ETL) and hole transporting layers (HTL) can be used only at the cathode side (ETL) or at the anode side (HTL) of the OLED stack. For optical out-coupling reasons, the use of material with a low refractive index at the light-emitting side allows for a further improved out-coupling of light from the organic layers into the glass substrate and subsequently from the glass into the environment of the OLED device. First electron transport materials arranged in a second electron transport layer stack according to the present invention have sufficiently low refractive indices capable to further improve the light out-coupling. To emit light, the electrode arranged at the light-emitting side has to transparent. Materials, which are sufficiently electrically conducting and simultaneously being transparent are metal oxides such as ITO commonly used as the anode. The second electrode has to be reflective in order to provide an OLED emitting light only to one side and therefore can be made of metal having good conductive properties suitable to form the cathode. To be able to arrange the second electron transport layer stack close to the transparent anode (first electrode), a first charge generation layer stack has to be arranged between the organic light-emitting layer stack and the electron transport layer stack comprising the first electron transport material at the anode side of the electrodes. The first charge generation layer stack hereby works as pn junction operating in the reverse direction so that due to band bending electrons can tunnel from the highest occupied molecular orbital (HOMO) to the lowest unoccupied molecular orbital (LUMO). This tunneling process supplies the stacked OLEDs with charge carriers (either electrons or holes), in case of a first charge generation layer at the anode side the supplied charge carriers are holes. This concept might also be used for stacking so that for n OLEDs in the stack (n−1) charge generation layers are needed. The charge generation layers can be compared in their function with a metallic inter-electrode, since they supply carriers. With this first charge generation layer stack, the optical properties of the first electron transport material with low refractive index can also be utilized at the side of the first electrode being the anode, if applied as a second electron transport layer stack. A layer with a low refractive index arranged close to the anode will strongly reduce the amount of light being reflected from the interface to the transparent substrate in case of a bottom emitting OLED and subsequently will improve the amount of light being coupled out of the OLED device. The amount of light trapped within the substrate might be increased compared to OLED devices not comprising the first electron transport material. However the light trapped within the transparent substrate can be coupled out to the environment by applying known out-coupling structures to the transparent substrate to further improve the light out-coupling. Since OLED devices could be used for room illumination, the values of the refractive indices given or discussed within the present invention refer to wavelengths within the visual spectrum.

Additionally the first charge generation layer de-couples the charge injection properties of the OLED stack from the work function of the ITO anode maintaining good charge injection properties of the OLED device. Especially injection of holes from the ITO anode as the first electrode depends critically on the work function of the ITO material. Cleaning of the ITO layer or the preparation of the ITO surface before deposition may have a strong influence on the work function of ITO and therefore on the injection barrier. Using a charge generation layer stack comprising an n-doped layer facing towards the first electrode and a p-doped layer facing towards the organic light-emitting layer stack enables to switch between hole and electron transport for the charge transport. After applying a driving voltage and therefore an electrical field across the electroluminescent layer the charge generation layer stack separates electron and holes. The electrons at the anode side (here the first electrode) can easily reach the anode without experiencing an energy barrier. This technique de-couples the first electrode from the remaining layers of the electroluminescent layer stack.

In another embodiment the second electron transport layer stack further comprises an n-doped layer arranged between the first electron transport layer and the first electrode to further improve the light out-coupling properties of the second electron transport layer stack. This n-doped layer is also used to further improve the injection of electrons from the electron transport layer into the first electrode. Suitable doping levels are typically 3-10%.

The present electron transport layer stack(s) at least lower the average refractive index of all the organic layers and subsequently at least a part of the light otherwise being wave guided in the first electrode/organic light-emitting layer stack is able to penetrate into the glass substrate.

In another embodiment the electroluminescent layer stack further comprises a second charge generation layer stack arranged between the first electron transport layer stack and the second electrode, wherein the second charge generation layer stack comprises an n-doped layer and a p-doped layer, wherein the p-doped layer faces towards the second electrode. Using a charge generation layer stack enables to use a hole transport layer for the charge transport on the cathode side. It also de-couples the charge injection properties of the OLED stack from the work function of the second electrode as the cathode further improving the charge injection properties of the OLED device. After applying a driving voltage and therefore an electrical field across the electroluminescent layer also the second charge generation layer stack separates electron and holes. The holes from the p-doped layer at the cathode side (here the second electrode) can easily reach the cathode without experiencing an energy barrier. This technique decouples the second electrode from the remaining layers of the electroluminescent layer stack. The materials n-doped and p-doped layers of the second charge generation layer stack might be commercially available materials, e.g. n- and p-doped materials from NOVALED. In a preferred embodiment a second hole transport layer is arranged between the second charge generation layer stack and the second electrode, preferably additionally a p-doped intermediate layer is arranged between the hole transport layer and the second electrode. The second hole transport layer further improves the effect of the present second charge generation layer.

In an alternative embodiment of the present invention, the first electron transport layer stack arranged between the organic light emitting layers stack and the second electrode might be replaced by the second charge generation layer and a hole transport layer arranged between the second charge generation layer and the second electrode having also a low refractive index comparable to the refractive index of the first electron transport material. This alternative embodiment also provides an OLED device with improved light out-coupling properties. To be able to apply a hole transport layer at the side of the second electrode in case of being the cathode, a charge generation layer is required for the same reasons as previously described for the first charge generation layer enabling the use of the electron transport layer at the side of the first electrode being the anode.

In another embodiment the first charge generation layer stack and/or the second charge generation layer stack further comprise a barrier layer between the n- and p-doped layers in order to at least hamper the diffusion of n-dopants into the p-doped layer and/or of p-dopants into the n-doped layer. Barrier layers have thicknesses of typically 1-10 nm. Suitable barrier layers are for example pentacen or NET-39 from NOVALED.

The invention further relates to a method to manufacture an organic electroluminescent device with an electroluminescent layer stack as claimed in the present invention, comprising the steps of providing a substrate covered with at least a first electrode;
depositing at least the organic light-emitting layer stack on top of the first electrode;
depositing a first electron transport layer stack comprising an electron transport layer made of a first electron transport material having a low refractive index and at least one n-doped layer on top of the organic light-emitting layer stack; and
depositing the second electrode on top of the first electron transport layer stack.

The layer stack as claimed above provides a top emitting OLED device according to the present invention. Additionally the electroluminescent layer stack might be encapsulated, e.g. by a cover lid. The cover lid might be equipped with getter materials. The organic layers may be deposited by thermal evaporation. In case of hole transport layers, these layers might be deposited alternatively by spin coating.

In an embodiment the step of depositing the first electron transport layer stack comprises the steps of depositing the n-doped layer on top of the organic light-emitting layer stack;
depositing the electron transport layer on top of the n-doped layer; and
depositing another n-doped layer on top of the first electron transport layer.

As an example, the n-doped layers can be deposited with the same deposition techniques as described previously.

In another embodiment the method further comprising the steps of depositing a second electron transport layer stack comprising at least another electron transport layer made of the first electron transport material on top of the first electrode; and
depositing a first charge generation layer stack on top of the second electron transport layer stack, wherein the first charge generation layer stack comprises at least an n-doped layer and a p-doped layer facing towards the organic light-emitting layer stack.

In another embodiment the step of depositing the second electron transport layer stack further comprises the step of depositing an n-doped layer between the electron transport layer and the first electrode. As an example, the n-doped layer can be deposited with the same deposition techniques as described previously.

In another embodiment the method further comprises the step of depositing a second charge generation layer stack between the first electron transport layer stack and the second electrode, wherein the second charge generation layer stack comprise a n-doped layer and a p-doped layer, wherein the p-doped layer faces towards the second electrode. The second charge generation layer stack might be deposited in the same manner as the first charge generation layer stack.

In an alternative embodiment of the method, the step of depositing a first electron transport layer stack comprising an electron transport layer made of a first electron transport material having a low refractive index and at least one n-doped layer on top of the organic light-emitting layer stack might be replaced by the step of depositing a charge generation layer stack between the organic light-emitting layer stack and the second electrode, wherein this charge generation layer stack comprise a n-doped layer and a p-doped layer, wherein the p-doped layer faces towards the second electrode. This charge generation layer stack might be deposited in the same manner as the second charge generation layer stack. Furthermore a hole transport layer or hole transport layer stack is deposited between the charge generation layer stack and the second electrode, where the hole transport layer is made of a hole transport material having a low refractive index in accordance to the present invention.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
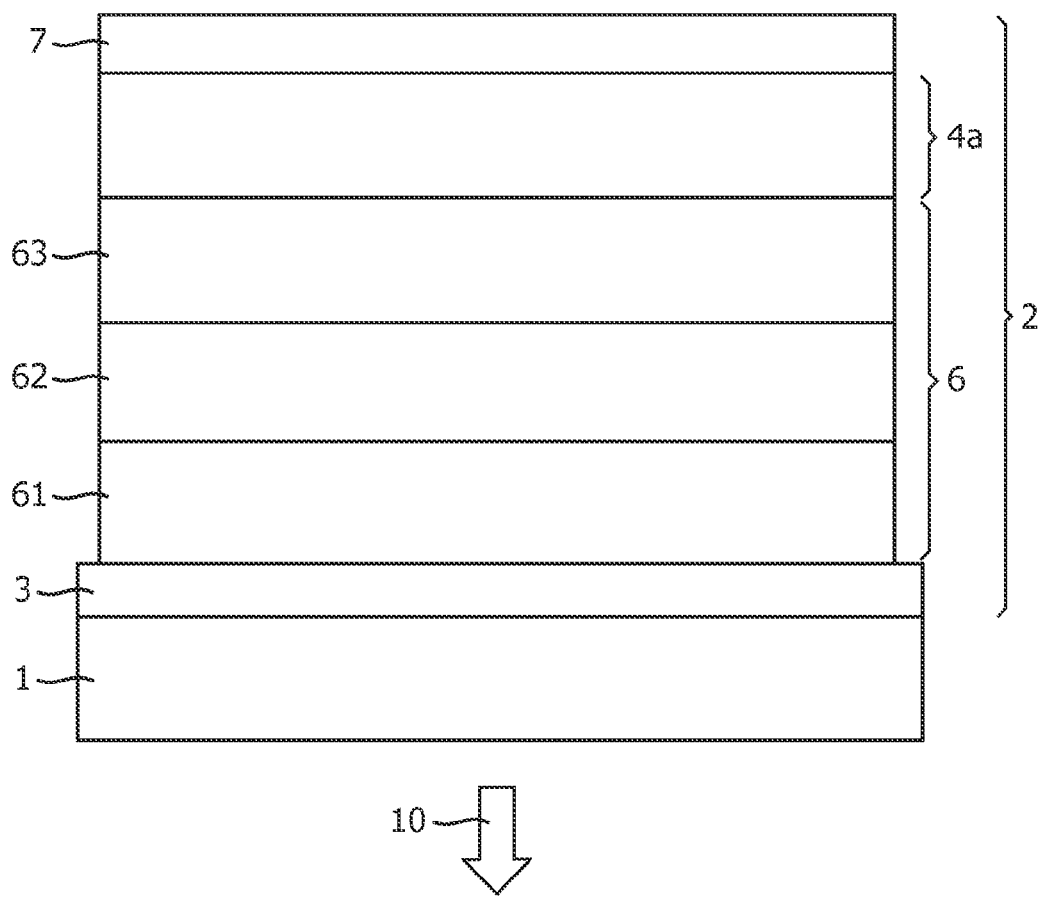
FIG. 1: an embodiment of an organic electroluminescent device in accordance to the present invention.

FIG. 1 shows an embodiment of an OLED in accordance to the present invention, where an electroluminescent layer stack 2 is deposited on top of a transparent borosilicate glass substrate 1, where the electroluminescent layer stack 2 comprises an organic light-emitting layer stack 6 with a hole transporting layer 61 (e.g. α-NPD), a light-emitting layer 62 (e.g. α-NPD:Ir(MDQ)$_2$ acac), and an electron transporting layer 63 (e.g. Alq$_3$) sandwiched between a first electrode 3 made of ITO facing towards the glass substrate 1 and a second electrode 7 made of aluminum to apply a driving voltage typically between 2-15 V to the organic light-emitting layer stack 6. Furthermore a first electron transport layer stack 4a is arranged between the organic light emitting layers stack 6 and the second electrode 7, wherein the electron transport layer stack 4a comprises an electron transport layer 41 made of a first electron transport material having a low refractive index and at least one n-doped layer. The first electron transport material may consist of an organic compound comprising Fluor atoms in order to achieve a low refractive index. Preferably the first electron transport material has a refractive index $n<1.6$, more preferably a refractive index $<1.5$. The OLED device shown in FIG. 1 as well as in the following figures is shown as a so-called bottom emitter, because the light 10 is emitted through the transparent substrate. However, the light may also be emitted through the second electrode in other embodiment. In an preferred embodiment the first electron transport material is 2,4,6-tris-(nonafluorobiphenyl)-1,3,5-triazine with the following chemical formula having a refractive index ranging between 1.53 and 1.57 depending on the particular wavelength:

Chemical Formula 1:
2,4,6-tris-(nonafluorobiphenyl)-1,3,5-triazine

Typical thicknesses of the layers within the electroluminescent layer stack may vary between 3 nm and 300 nm. In another embodiment an additional p-doped intermediate layer (not shown here) might be arranged between the hole transport layer 61 and the first electrode 3.

Figure 2:
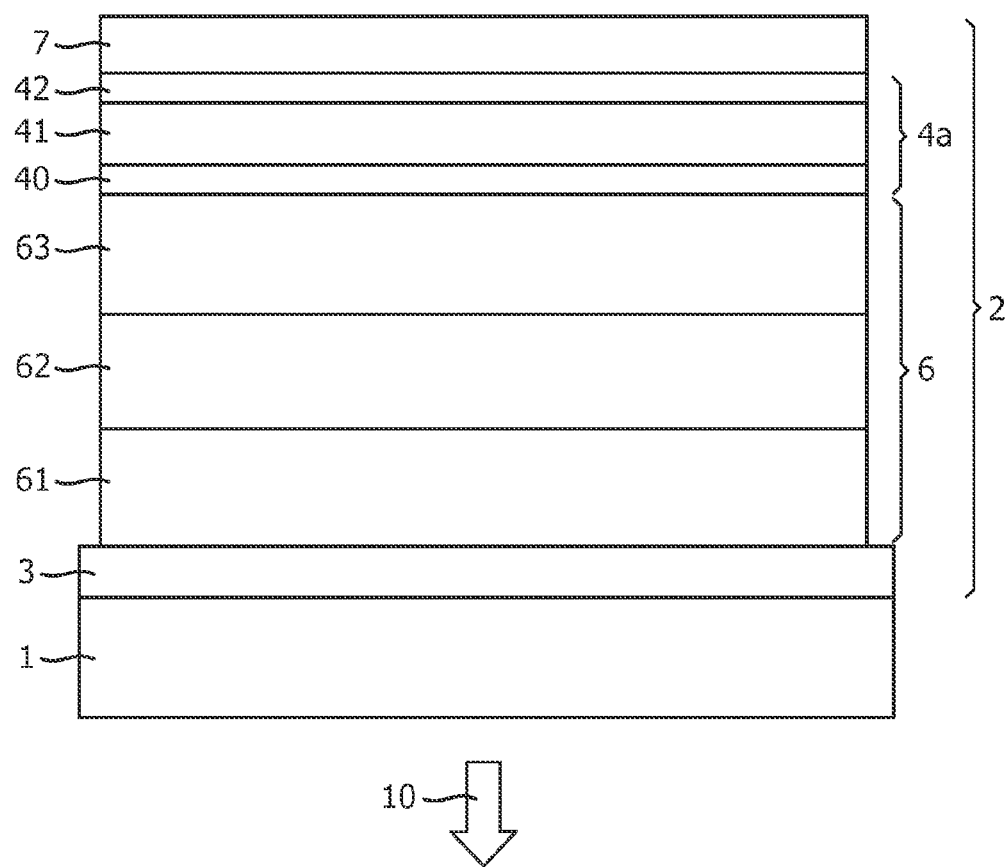
FIG. 2: another embodiment of an organic electroluminescent device in accordance to the present invention with the electron transport layer of the first electron transport layer stack arranged between n-doped layers.

FIG. 2 shows another embodiment of an organic electroluminescent device in accordance to the present invention, where the electron transport layer 41 of the first electron transport layer stack 4b is arranged between n-doped layers 40, 42.

Figure 3:
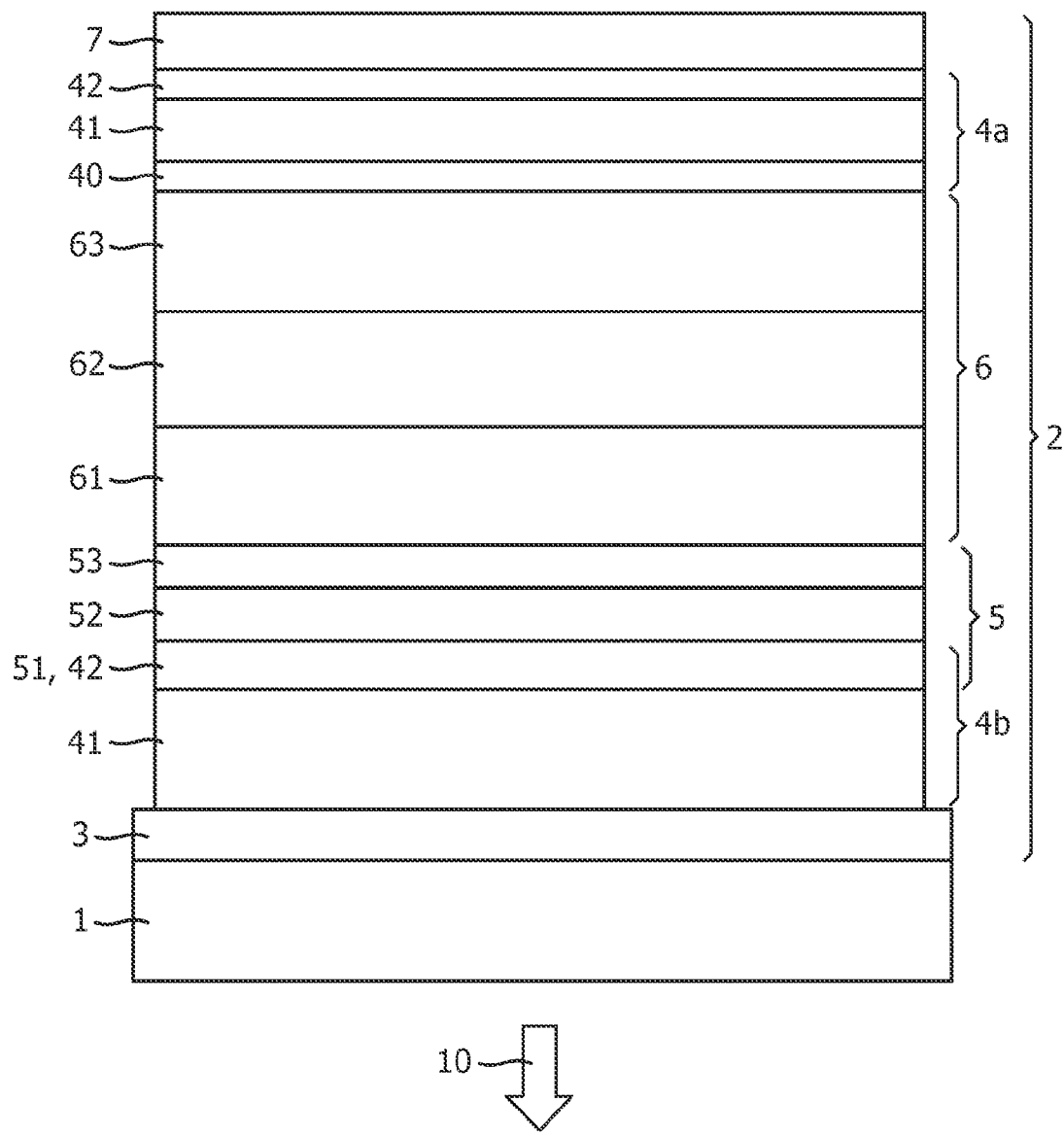
FIG. 3: another embodiment of an organic electroluminescent device in accordance to the present invention with a charge generation layer stack and an additional second electron layer stack arranged between charge generation layer stack and first electrode.

FIG. 3 shows another embodiment of an organic electroluminescent device in accordance to the present invention, where a charge generation layer stack 5 and an additional second electron transport layer stack 4b are arranged between a charge generation layer stack 5 and the first electrode 3. The first charge generation layer stack 5 comprises at least an n-doped layer 51 facing towards the first electrode 3 and a p-doped layer 53 facing towards the organic light-emitting layer stack 6. Here the n-doped layer 51 has a double function also acting as an n-doped layer as part of the second electron transport layer stack 4b. Furthermore a barrier layer 52 is arranged between the n- and p-doped layers 51, 53 in order to at least hamper the diffusion of n-dopants into the p-doped layer 53 and/or of p-dopants into the n-doped layer 51. The second electron transport layer stack 4b may comprise the same electron transport layer made of the first electron transport material as present in the first electron transport layer stack 4a.

Figure 4:
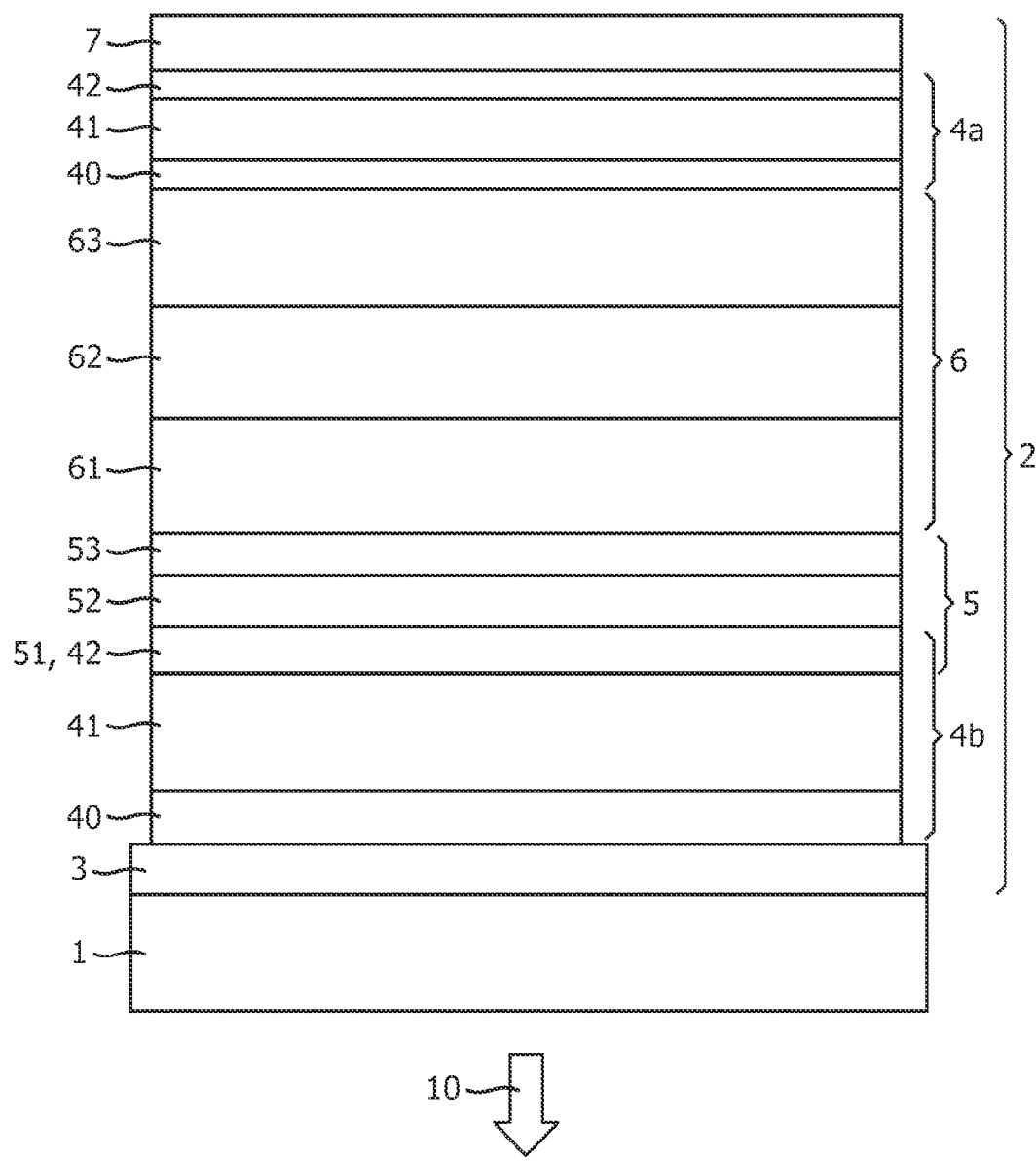
FIG. 4: another embodiment of an organic electroluminescent device in accordance to FIG. 3 with an additional n-doped layer within the second electron transport layer stack facing towards the first electrode.

FIG. 4 shows another embodiment of an organic electroluminescent device in accordance to FIG. 3 with an additional n-doped layer 40 within the second electron transport layer stack 4b facing towards the first electrode 3 in order to sandwich the electron transport layer 41 between two n-doped layers 40, 42 (51).

Figure 5:
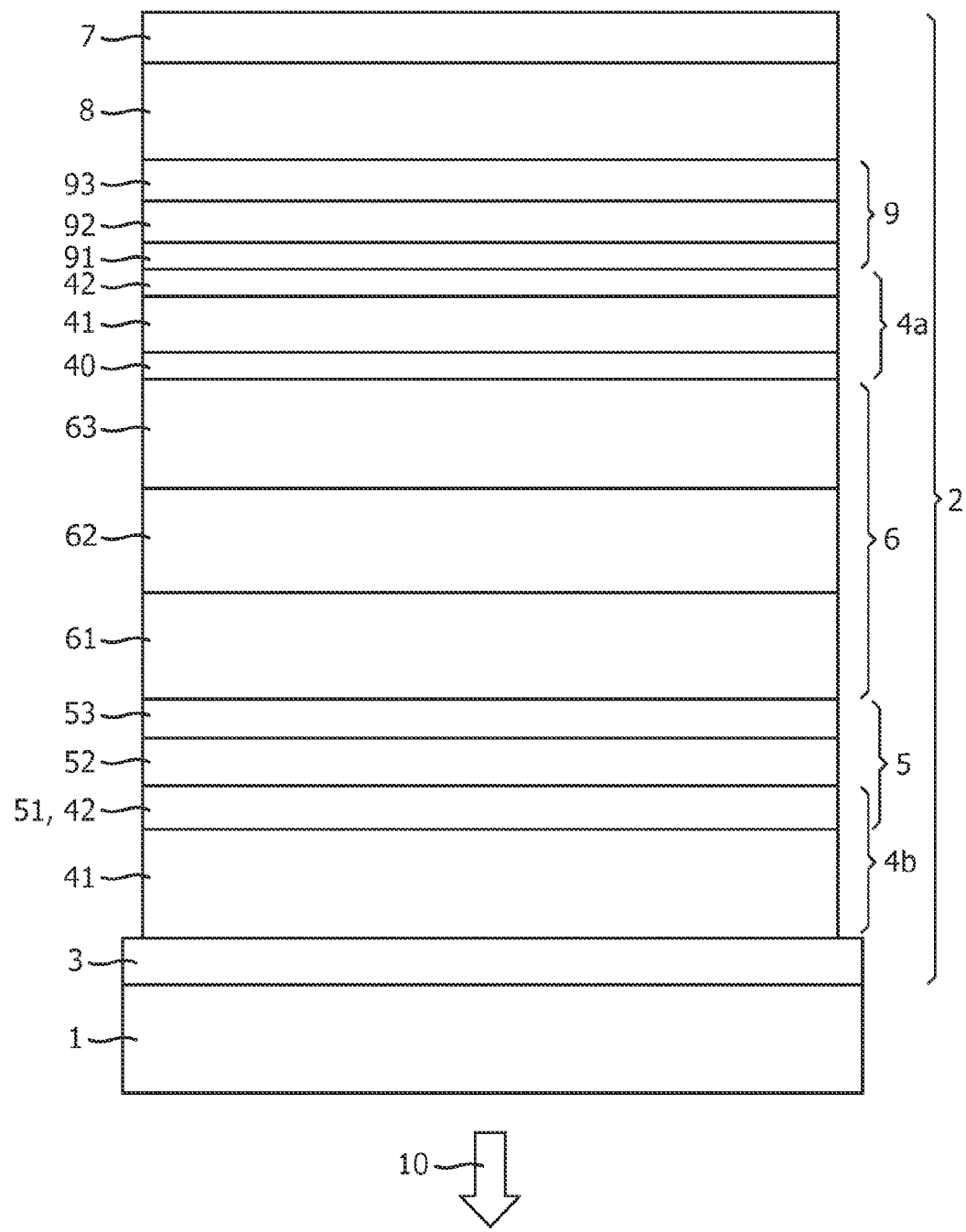
FIG. 5: another embodiment of an organic electroluminescent device in accordance to the present invention with a second charge generation layer stack between the first electron transport layer stack and the second electrode.

FIG. 5 shows another embodiment of an organic electroluminescent device in accordance to the present invention, where a second charge generation layer stack 9 between the first electron transport layer stack 4a and the second electrode 7 as the cathode in order to de-couple the cathode from the remaining electroluminescent layer stack. In this case a hole transport layer 8 is arranged between the second charge generating layer stack 9 and the cathode 7. In another embodiment an additional p-doped intermediate layer (not shown here) might be arranged between the hole transport layer and the second electrode 7.

Figure 6:
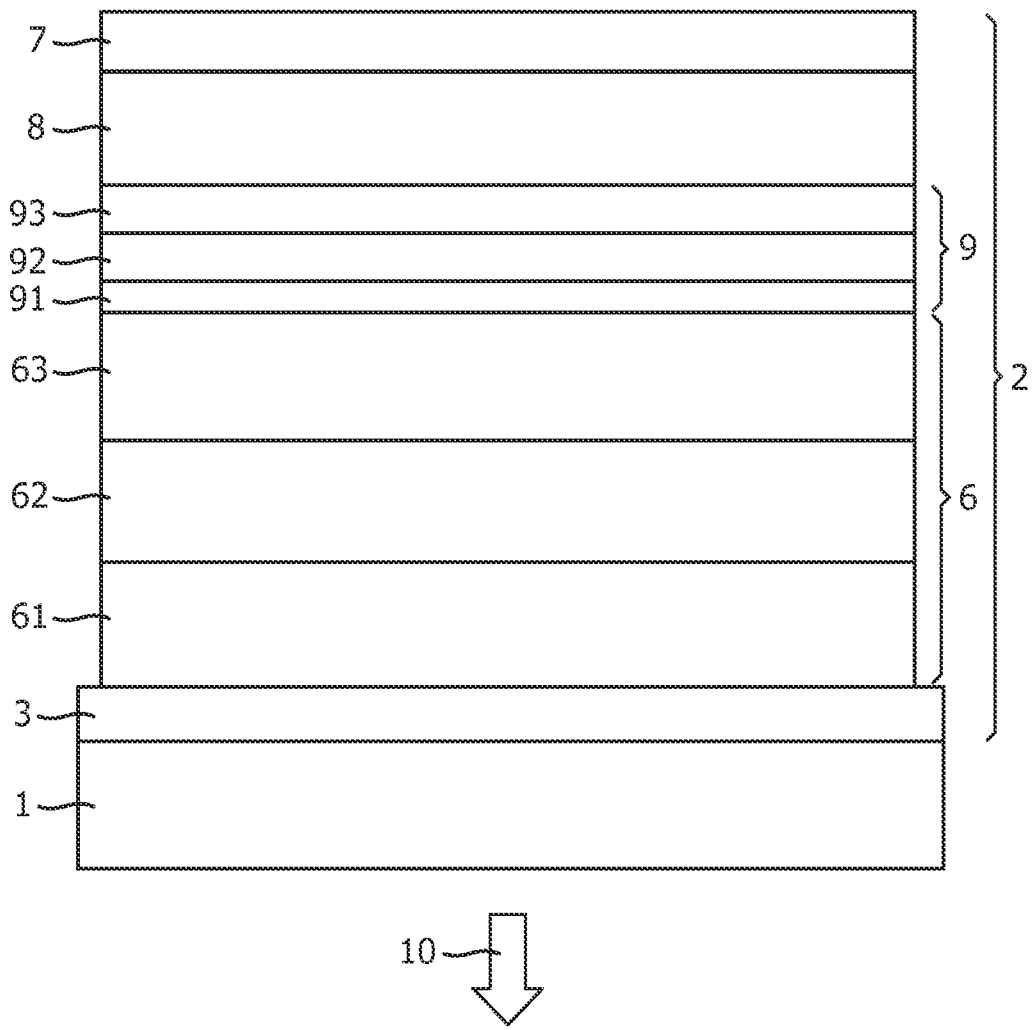
FIG. 6: an alternative embodiment, where the first electron transport layer stack is replaced by a charge generation layer stack and a hole transport layer made of a low refractive index material.

FIG. 6 shows an alternative embodiment, where the first electron transport layer stack 4a is replaced by a charge generation layer stack 9 and a hole transport layer 8 made of a low refractive index material. Here the OLED device might comprise only one charge generation layer stack 9. Alternative embodiments of OLED devices in accordance to FIG. 6 may additionally comprise first charge generation layer stacks 5 and second electron transport layer stacks 4b as shown in FIGS. 4 and 5.

In another alternative embodiment of an organic electroluminescent device in accordance with the present invention, the electroluminescent layer stack might be arranged as a top emitter where the light is emitted through the side opposite to the substrate side. In contrast to the OLED devices as bottom emitter as shown in the previous figures, the top emitting OLED device comprises a transparent second electrode and a first electrode, which does not have to be transparent. The substrate does not have to be transparent, e.g. being a metal substrate. The electroluminescent layer stack 2 is encapsulated to prevent moisture and/or oxygen penetrating the electroluminescent layer 2. In case of a top emitting OLED device, this encapsulation has to be transparent, e.g. as a cover lid made of glass.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

LIST OF REFERENCE SIGNS

1 substrate
2 electroluminescent layer stack
3 first electrode
4a first electron transport layer stack
4b second electron transport layer stack
40 n-doped layer of the first/second electron transport layer stack
41 electron transport layer made of the first electron transport material of the first/second electron transport layer stack
42 n-doped layer of the first/second electron transport layer stack
5 first charge generation layer stack
51 n-doped layer of the first charge generation layer stack
52 barrier layer of the first charge generation layer stack
53 p-doped layer of the first charge generation layer stack
6 organic light-emitting layer stack
61 hole transporting layer
62 light emitting layer
63 electron transporting layer
7 second electrode
8 second hole transport layer
9 second charge generation layer stack
91 n-doped layer of the second charge generation layer stack
92 barrier layer of the second charge generation layer stack
93 p-doped layer of the second charge generation layer stack
10 light emitted from the OLED device

The invention claimed is:

1. An organic electroluminescent device comprising an electroluminescent layer stack on top of a substrate, the electroluminescent layer stack comprising an organic light-emitting layer stack with one or more organic layers sandwiched between a first electrode facing towards the substrate and a second electrode to apply a driving voltage to the organic light-emitting layer stack, and a first electron transport layer stack arranged between the organic light emitting layers stack and the second electrode, wherein the electron transport layer stack comprises an electron transport layer made of a first electron transport material having a low refractive index and at least one n-doped layer, wherein the organic electroluminescent device further comprises a first charge generation layer stack arranged between the first electrode and the organic light-emitting layer stack, wherein the first charge generation layer stack comprises at least a n-doped layer facing towards the first electrode and a p-doped layer facing towards the organic light-emitting layer stack and at least a second electron transport layer stack arranged between the first charge generation layer stack and the first electrode, the second electron transport layer stack being in contact with the first electrode, and the second electron transport layer stack comprising at least another electron transport layer made of the first electron transport material.

2. The organic electroluminescent device as claimed in claim 1, wherein the first electron transport material has a refractive index n between 1.3 and 1.65, preferably a refractive index n between 1.4 and 1.57.

3. The organic electroluminescent device as claimed in claim 1, wherein the first electron transport material is an organic compound comprising Fluor atoms, preferably first electron transport material is fully fluorinated.

4. The organic electroluminescent device as claimed in claim 3, wherein the first electron transport material is 2,4,6-tris-(nonafluorobiphenyl)-1,3,5-triazine.

5. The organic electroluminescent device as claimed in claim 3, wherein the first electron transport layer stack further comprises two n-doped layers, where the electron transport layer is arranged in between the two n-doped layers.

6. The organic electroluminescent device as claimed in claim 3, wherein the organic electroluminescent device further comprises a first charge generation layer stack arranged between the first electrode and the organic light-emitting layer stack, wherein the first charge generation layer stack comprises at least a n-doped layer facing towards the first electrode and a p-doped layer facing towards the organic light-emitting layer stack and at least a second electron transport layer stack arranged between the first charge generation layer stack and the first electrode comprising at least another electron transport layer made of the first electron transport material.

7. The organic electroluminescent device as claimed in claim 6, wherein the second electron transport layer stack further comprises a n-doped layer arranged between the electron transport layer and the first electrode.

8. The organic electroluminescent device as claimed in claim 6, wherein the electroluminescent layer stack further comprises a second charge generation layer stack arranged between the first electron transport layer stack and the second electrode, wherein the second charge generation layer stack comprises a n-doped layer and a p-doped layer, wherein the p-doped layer faces towards the second electrode.

9. The organic electroluminescent device as claimed in claim 8, wherein a second hole transport layer is arranged between the second charge generation layer stack and the second electrode, and a p-doped intermediate layer is arranged between the hole transport layer and the second electrode.

10. The organic electroluminescent device as claimed in claim 1, wherein the first charge generation layer stack and/or the second charge generation layer stack further comprise a barrier layer between the n- and p-doped layers in order to at least hamper the diffusion of n-dopants into the p-doped layer and/or of p-dopants into the n-doped layer.

11. A method to manufacture an organic electroluminescent device with an electroluminescent layer stack as claimed in claim 1, comprising the steps of
   providing a substrate covered with at least a first electrode;
   depositing at least the organic light-emitting layer stack on top of the first electrode;
   depositing a first electron transport layer stack comprising an electron transport layer made of a first electron transport material having a low refractive index and at least one n-doped layer on top of the organic light-emitting layer stack; and
   depositing the second electrode on top of the first electron transport layer stack.

12. The method according to claim 11, wherein the step of depositing the first electron transport layer stack comprises the steps of
   depositing the n-doped layer on top of the organic light-emitting layer stack;
   depositing the electron transport layer on top of the n-doped layer; and
   depositing another n-doped layer on top of the first electron transport layer.

13. The method according to claim 11, further comprising the steps of
   depositing a second electron transport layer stack comprising at least another electron transport layer made of the first electron transport material on top of the first electrode; and
   depositing a first charge generation layer stack on top of the second electron transport layer stack, wherein the first charge generation layer stack comprises at least an n-doped layer and a p-doped layer facing towards the organic light-emitting layer stack.

14. The method according to claim 13, wherein the step of depositing the second electron transport layer stack further comprises the step of depositing a n-doped layer between the electron transport layer and the first electrode.

15. The method according to any of the claim 11, further comprising the step of depositing a second charge generation layer stack between the first electron transport layer stack and the second electrode, wherein the second charge generation layer stack comprise a n-doped layer and a p-doped layer, wherein the p-doped layer faces towards the second electrode.

* * * * *